United States Patent
Chen et al.

(10) Patent No.: US 8,848,325 B2
(45) Date of Patent: Sep. 30, 2014

(54) HIGH VOLTAGE SEMICONDUCTOR ELEMENT AND OPERATING METHOD THEREOF

(75) Inventors: Hsin-Liang Chen, Taipei (TW); Wen-Ching Tung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 192 days.

(21) Appl. No.: 13/401,652

(22) Filed: Feb. 21, 2012

(65) Prior Publication Data

US 2013/0214821 A1    Aug. 22, 2013

(51) Int. Cl.
*H03K 17/06*    (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS 6,323,074 B1 *  11/2001  Jiang et al. ............... 438/202
2013/0093009 A1 *  4/2013  Chen et al. ............... 257/335

* cited by examiner

*Primary Examiner* — Jared Fureman
*Assistant Examiner* — Kevin J Comber
(74) *Attorney, Agent, or Firm* — McClure, Qualey & Rodack, LLP

(57) ABSTRACT

A high voltage semiconductor element and an operating method thereof are provided. The high voltage semiconductor element comprises a high voltage metal-oxide-semiconductor transistor (HVMOS) and a NPN type electro-static discharge bipolar transistor (ESD BJT). The HVMOS has a drain and a source. The NPN type ESD BJT has a first collector and a first emitter. The first collector is electronically connected to the drain, and the first emitter is electronically connected to the source.

9 Claims, 4 Drawing Sheets

HIGH VOLTAGE SEMICONDUCTOR ELEMENT AND OPERATING METHOD THEREOF

BACKGROUND OF THE INVENTION

1. Field of the Invention

The invention relates in general to a semiconductor element and an operating method thereof, and more particularly to a high voltage semiconductor element and an operating method thereof.

2. Description of the Related Art

With the development of semiconductor technology, a bipolar COMS DMOS (BCD) manufacturing technology has been widely used for a high voltage semiconductor element. An operating voltage of a semiconductor element for the BCD manufacturing technology has been higher and higher, such that an on-chip electro-static discharge (ESD) protection design becomes a challenging task.

A high voltage semiconductor element usually has low on-state resistance (Rdson), so an electro-static current is likely to concentrate in a surface or an edge of a drain during an electro-static event. High voltage current and high electric field will cause a physical destruction at a surface junction region.

Based on a requirement for lowering the on-state resistance (Rdson), the surface or a lateral side of the high voltage semiconductor element cannot be increased. Therefore, it is a challenge to get a better ESD protection structure.

Further, a breakdown voltage of the high voltage semiconductor element is always greater than the operation voltage thereof. A trigger voltage of the high voltage semiconductor element is often higher than the breakdown voltage thereof quite a lot. Therefore, a protected device or an internal circuit usually has risks of damages, before the high voltage semiconductor element turns on an ESD protection during the electro-static event. To reduce the trigger voltage, it is needed an additional external ESD detection circuit.

Moreover, the high voltage semiconductor element usually has a low holding voltage. There is a possibility that the high voltage semiconductor element is triggered by an unwanted noise, a power-on peak voltage or a serge voltage and a latch-up may occur during a normal operation.

Further, the high voltage semiconductor element usually has a field plate effect. The distribution of the electric field is sensitive, so the electro-static current is easy to concentrate at the surface or the edge of the drain during the electro-static event.

There are some methods for the ESD protection; however, those methods will increase some additional masks or manufacturing steps. Another method for the ESD protection is to add an additional device used for ESD protection only. The additional ESD device is a big size diode, a bipolar transistor (BJT), a metal oxide semiconductor transistor (MOS) being increased the surface or the lateral side, or a silicon controlled rectifier (SCR). Wherein, the silicon controlled rectifier (SCR) has a low holding voltage, so the latch-up may easily occur during the normal operation.

According to the actual state, the electro-static event has been a bottleneck of the development of the high voltage semiconductor element. It is needed to make a breakthrough on this technology.

SUMMARY OF THE INVENTION

The invention is directed to a high voltage semiconductor element and an operating method thereof. A high voltage metal-oxide-semiconductor transistor (HVMOS) and an electro-static discharge bipolar transistor (ESD BJT) are integrated into one element, such that it can prevent from a latch-up, any mask or any manufacturing step will not be added and the volume of the high voltage semiconductor element will not be increased too much.

According to a first aspect of the present invention, a high voltage semiconductor element is provided. The high voltage semiconductor element comprises a high voltage metal-oxide-semiconductor transistor (HVMOS) and a NPN type electro-static discharge bipolar transistor (ESD BJT). The HVMOS has a drain and a source. The NPN type ESD BJT has a first collector and a first emitter. The first collector is electronically connected to the drain, and the first emitter is electronically connected to the source.

According to a second aspect of the present invention, an operating method of a high voltage semiconductor element is provided. The operating method comprises the following steps. A high voltage metal-oxide-semiconductor transistor (HVMOS) and a NPN type electro-static discharge bipolar transistor (ESD BJT) are provided. The HVMOS has a drain, a source and a gate. The NPN type ESD BJT has a first collector and a first emitter. The first collector is electronically connected to the drain, and the first emitter is electronically connected to the source. An operating current is injected to the HVMOS when the HVMOS is switched on. An electro-static current is injected to the NPN type ESD BJT when the HVMOS is switched off and an electro-static event is happened.

The invention will become apparent from the following detailed description of the preferred but non-limiting embodiments. The following description is made with reference to the accompanying drawings.

DETAILED DESCRIPTION OF THE INVENTION

Preferred embodiments are disclosed below for elaborating the invention. A high voltage metal-oxide-semiconductor transistor (HVMOS) and an electro-static discharge bipolar transistor (ESD BJT) are integrated into one element, such that it can prevent from any latch-up, any mask or any manufacturing step will not be added and the volume of the high voltage semiconductor element will not be increased too much. However, the following embodiments are for the purpose of elaboration only, not for limiting the scope of protection of the invention. Besides, secondary elements are omitted in the following embodiments to highlight the technical features of the invention.

First Embodiment

Figure 1:
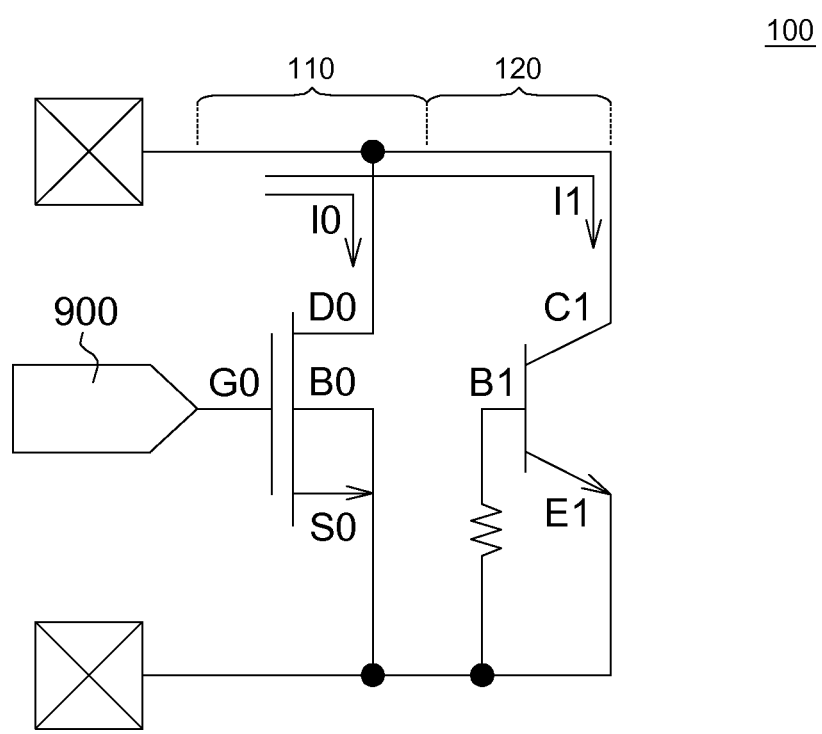
FIG. 1 shows a circuit diagram of a high voltage semiconductor element according to a first embodiment.

Referring to FIG. 1, a circuit diagram of a high voltage semiconductor element 100 according to a first embodiment is shown. The high voltage semiconductor element 100 has a high voltage metal-oxide-semiconductor transistor (HVMOS) 110 and a NPN type electro-static discharge bipolar transistor (ESD BJT) 120. The HVMOS 110 is used for switching a high voltage current. The HVMOS 110 has a drain D0, a source S0, a gate G0 and a base B0. The gate G0 is electronically connected to an internal circuit 900. When an inputting voltage of the gate G0 is higher than a trigger voltage, the HVMOS is switched on.

The NPN type ESD BJT 120 is used for receiving an unnecessary electro-static current for preventing the HVMOS 110 from any damage caused by the electro-static current. The NPN type ESD BJT 120 has a collector C1, an emitter E1 and a base B1. The collector C1 is electronically connected to the drain D0. The emitter E1 is electronically connected to the source S0.

In the present embodiment, the HVMOS 110 and the NPN type ESD BJT 120 are integrated into one element by a bipolar CMOS DMOS (BCD) manufacturing technology. The HVMOS 110 and the NPN type ESD BJT 120 are closely connected with each other and share some structure. In the present embodiment, it is no needed to increase any additional mask or any manufacturing step while the high voltage semiconductor element 100 is manufactured by the BCD manufacturing technology.

Regarding an operating method of the high voltage semiconductor element 100, the high voltage semiconductor element 100 is provided firstly. Next, when the HVMOS 110 is switched on, the operating I0 will injected to the HVMOS 110 and will not injected to the NPN type ESD BJT 120 because the HVMOS 110 has low on-state resistance (Rdson) and high breakdown voltage. Therefore, the HVMOS 110 can be operated normally.

When the HVMOS 110 is switched off and an electro-static event is happened, the NPN type ESD BJT 120 is easier to switch on than the HVMOS 110 being, such that the electro-static current I1 is injected to the NPN type ESD BJT 120 and is not injected to the HVMOS 110. Therefore, the HVMOS 110 can be prevented from any damage.

Figure 2:
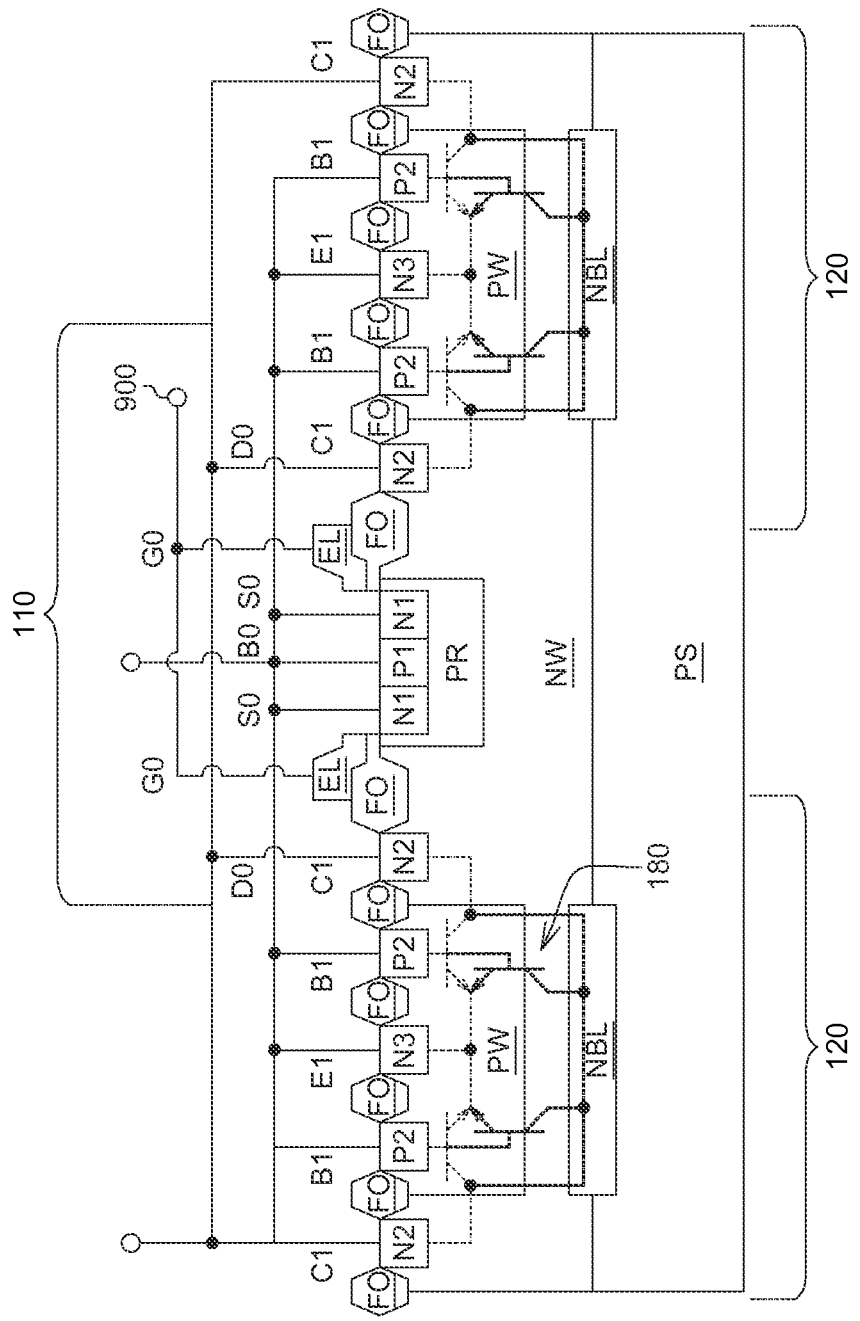
FIG. 2 shows a cross-section diagram of the high voltage semiconductor element according to the first embodiment.

Please refer to FIG. 2, which shows a cross-section diagram of the high voltage semiconductor element according to the first embodiment. The high voltage semiconductor element 100 includes a P type substrate PS, at least one N type barrier layer NBL, at least one N type well NW, at least one P type well PW, at least one P type doping region PR, a plurality of N type heavy doping region N1, N2, N3, a plurality of P type heavy doping region P1, P2, a plurality of insulating layer FO and a plurality of electrode layer EL.

The P type substrate PS, the N type well NW, the P type doping region PR, the N type heavy doping region N1, N2, the P type heavy doping region P1 and the electrode layer EL form the HVMOS. The N type heavy doping region N1 is the source S0, the N type heavy doping region N2 is the drain D0, the P type heavy doping region P1 is the base B0, and the electrode layer EL is the gate G0.

The N type well NW, the P type well PW, the N type heavy doping region N2, N3 and the P type heavy doping region P2 form the NPN type ESD BJT 120. The N type heavy doping N2 is the collector C1, the N type heavy doping region N3 is the emitter E1, and the P type heavy doping region P2 is the base B1.

As shown in FIG. 2, the HVMOS 110 and NPN type ESD BJT 120 are integrated into the same N type well NW, and the drain D0 of the HVMOS 110 and the collector C1 of the NPN type ESD BJT 120 are the same N type heavy doping region N2. That is to say, the HVMOS 110 and the NPN type ESD BJT 120 not only share the same N type well NW, but also share the same N type heavy doping region N2. The wire between the HVMOS 110 and the NPN type ESD BJT 120 can be shorten to prevent from any unnecessary electro-static current I1 (shown as FIG. 1).

Besides, please referring to FIG. 2, the N type well NW, the P type PW, the N type heavy doping region N3, the P type heavy doping region P2 and the N type barrier layer NBL form another NPN type ESD BJT 180 too. Several NPN type ESD BJTs 120, 180 are formed, such that the ESD protection can be improved greatly.

In the high voltage semiconductor element 100 of the present embodiment, the ESD protection is realized by the NPN type ESD BJT 120, 180, not a silicon controlled rectifier (SCR), such that the HVMOS 110 can has a high holding voltage to prevent from the latch-up.

Moreover, comparing to adding the additional element or increasing the surface, the HVMOS 110 and the NPN type ESD BJT 120 are integrated in one element, such that the volume of the high voltage semiconductor element 100 can be reduced greatly.

Second Embodiment

Figure 3:
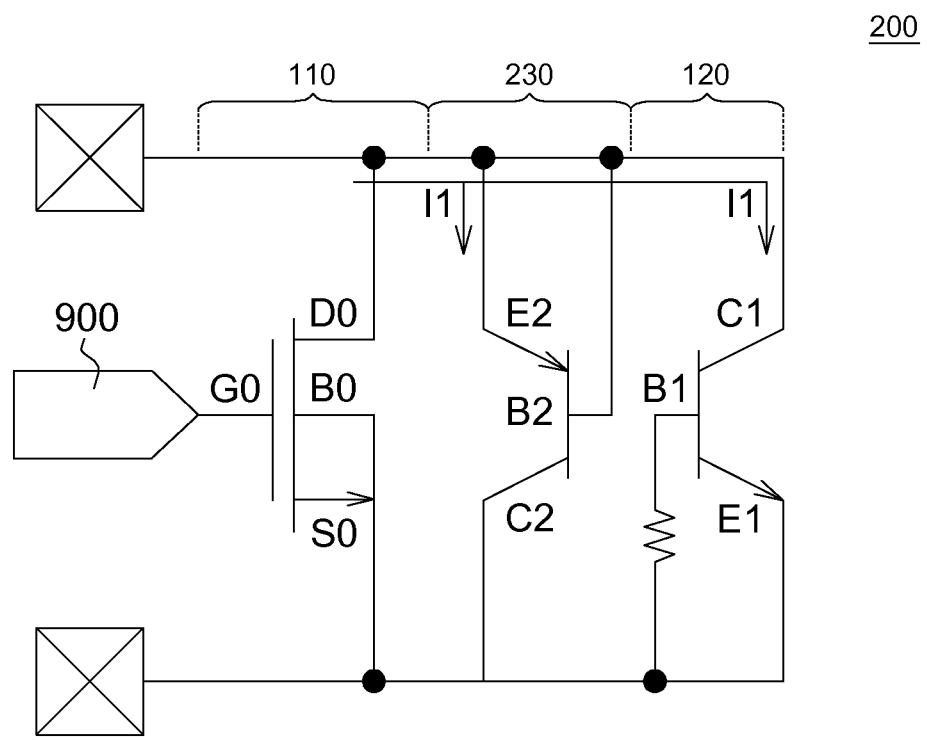
FIG. 3 shows a circuit diagram of a high voltage semiconductor element according to a second embodiment.

Please refer to FIG. 3, which shows a circuit diagram of a high voltage semiconductor element according to a second embodiment. The high voltage semiconductor element 200 and an operating method thereof of the present embodiment are different from the high voltage semiconductor element 100 and the operating method thereof of the first embodiment in that the high voltage semiconductor element 200 further comprises a PNP type ESD BJT 230, and the similarities are not repeated here.

As shown as FIG. 3, the PNP type ESD BJT 230 and the NPN type ESD BJT 120 are connected in parallel. The PNP type ESD BJT 230 has a collector C2, an emitter E2 and a base B2. The emitter E2 is electronically connected to the drain D0 and the collector C1. The collector C2 is electronically connected to the source S0 and the emitter E1.

In the present embodiment, the HVMOS 110, the NPN type ESD BJT 120 and the PNP type ESD BJT 230 can be integrated in one element by the BCD manufacturing technology. The HVMOS 110, the NPN type ESD BJT 120 and the PNP type ESD BJT 230 are closely connected with each other and share some structure. Because the high voltage semiconductor element 200 is manufactured by the BCD manufacturing technology, it is no needed to add any additional mask or any manufacturing step.

Regarding an operating method of the high voltage semiconductor element 200, the electro-static current I1 is injected to the NPN type ESD BJT 120 and the PNP type ESD BJT 230 both, but is not injected to the HVMOS 110. Therefore, the HVMOS 110 will not be caused any damage by the electro-static current I1.

Figure 4:
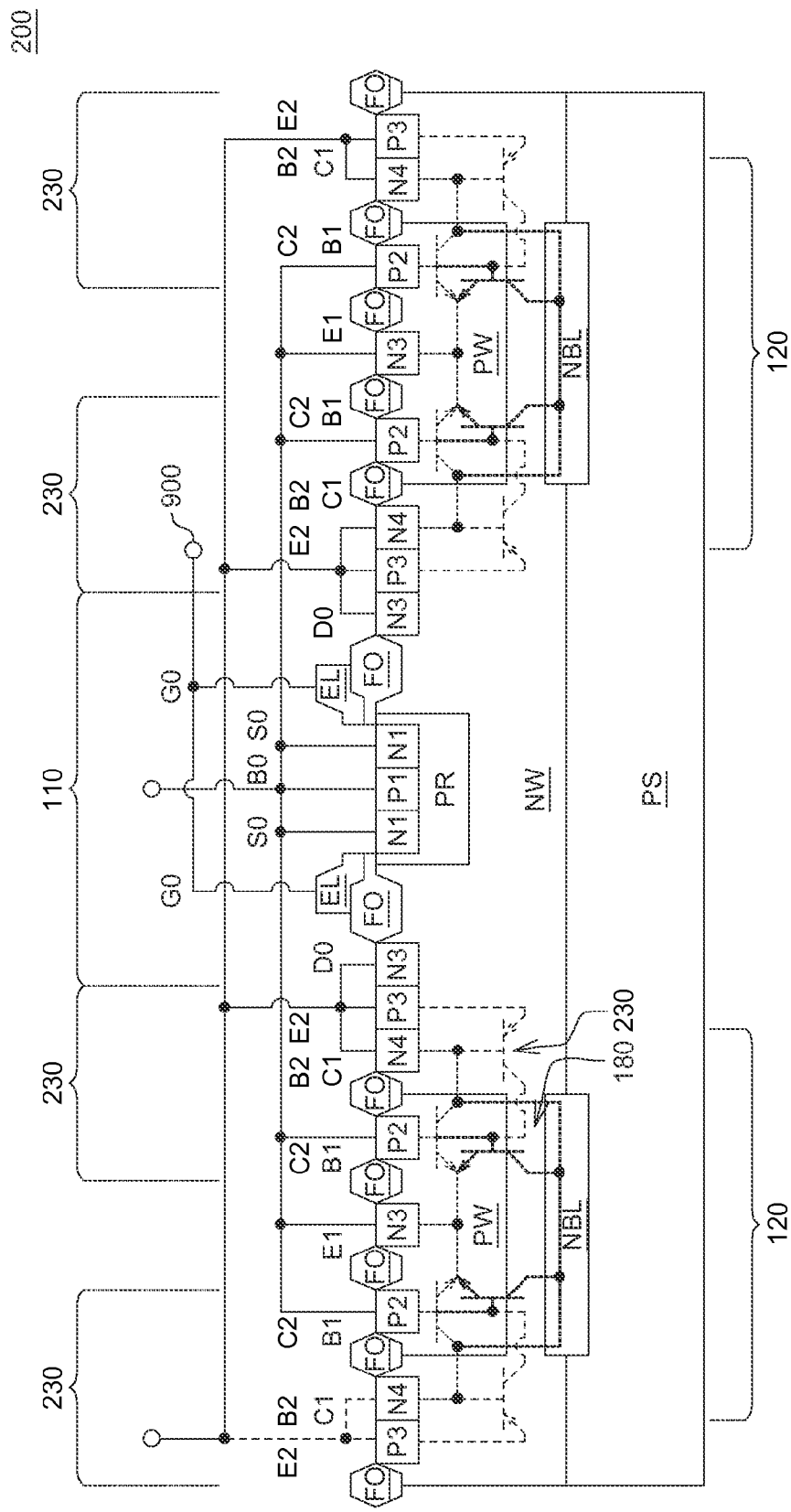
FIG. 4 shows a cross-section diagram of the high voltage semiconductor element according to the second embodiment.

Referring to FIG. 4, which shows a cross-section diagram of the high voltage semiconductor element according to the second embodiment. In the present embodiment, the shared N type heavy doping region N2 (shown in FIG. 2) is divided into the N type heavy doping region N3 and the N type heavy doping region N4. The P type heavy doping region P3 is added between the N type heavy doping region N3 and the N type heavy doping region N4.

As shown in FIG. 4, the HVMOS 110, the NPN type ESD BJT 120 and the PNP type ESD BJT 230 are disposed in the same N type well NW. The emitter E2 and the base B3 of the PNP type ESD BJT 230 and the collector C1 of the NPN type ESD BJT 120 are disposed in the same N type well NW. The collector C2 of the PNP type ESD BJT 230 and the base B1 and the emitter E1 of the NPN type ESD BJT 120 are disposed in the same P type well PW.

That is, the NPN type ESD BJT 120 and the PNP type ESD BJT 230 not only share the same N type well NW, but also share the same N type heavy doping region N4 and the same P type heavy doping P3. The wire among the HVMOS 110, the NPN type ESD BJT 120 and the PNP type ESD BJT 230 can be shorten to prevent from any unnecessary electro-static current 11 (shown as FIG. 1).

In the high voltage semiconductor element 200 of the present embodiment, the ESD protection is realized by the NPN type ESD BJT 120, 180 and the PNP type ESD BJT 230, not a silicon controlled rectifier (SCR), such that the HVMOS 110 can has a high holding voltage to prevent from the latch-up.

Moreover, comparing to adding the additional element or increasing the surface, the HVMOS 110, the NPN type ESD BJT 120 and the PNP type ESD BJT 230 are integrated in one element, such that the volume of the high voltage semiconductor element 200 can be reduced greatly.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high voltage semiconductor element, comprising: a high voltage metal-oxide-semiconductor transistor (HVMOS), having a drain and a source;
   a first NPN type electro-static discharge bipolar transistor (ESD BJT), having a first collector and a first emitter, wherein the first collector is electronically connected to the drain, and the first emitter is electronically connected to the source; and
   a second NPN type ESD BJT, having a second collector and a second emitter, wherein the second collector is electronically connected to a N type barrier layer, and the second emitter and the first emitter are the same N type heavy doping region;
   wherein the HVMOS and the ESD BJT are disposed in the same N type well.

2. The high voltage semiconductor element according to claim 1, wherein the drain of the HVMOS and the first collector of the first NPN type ESD BJT are the same N type heavy doping region.

3. The high voltage semiconductor element according to claim 1, further comprising: a PNP type ESD BJT, wherein the PNP type ESD BJT and the first NPN type ESD BJT are connected in parallel.

4. The high voltage semiconductor element according to claim 3, wherein the PNP type ESD BJT has a third emitter and a third collector, the third emitter is electronically connected to the drain and the first collector, and the third collector is electronically connected to the source and the first emitter.

5. The high voltage semiconductor element according to claim 3, wherein the HVMOS, the first NPN type ESD BJT and the PNP type ESD BJT are disposed in the same N type well.

6. The high voltage semiconductor element according to claim 3, wherein the PNP type ESD BJT has a third emitter, and the third emitter and the first collector are disposed in the same N type well.

7. The high voltage semiconductor element according to claim 4, wherein the PNP type ESD BJT has a third collector, and the third collector and the first emitter are disposed in the same P type well.

8. An operating method of a high voltage semiconductor element, comprising: providing a high voltage metal-oxide-semiconductor transistor (HVMOS), a first NPN type electro-static discharge bipolar transistor (ESD BJT) and a second NPN type ESD BJT, wherein the HVMOS has a drain, a source and a gate, the first NPN type ESD BJT has a first collector and a first emitter, the second NPN type ESD BJT has a second collector and a second emitter, the first collector is electronically connected to the drain, the first emitter is electronically connected to a N barrier layer, and the second emitter and the first emitter are the same N type heavy doping region;
   injecting an operating current to the HVMOS when the HVMOS is switched on; and
   injecting an electro-static current to the first NPN type ESD BJT and the second NPN type ESD BJT when the HVMOS is switched off and an electro-static event is happened;
   wherein the HVMOS and the ESD BJT are disposed in the same N type well.

9. The operating method of the high voltage semiconductor element according to claim 8, wherein in the step of providing the high voltage semiconductor element, the high voltage semiconductor element further comprises a PNP type ESD BJT, and the PNP type ESD BJT and the first NPN type ESD BJT are connected in parallel; and in the step of the electro-static event, the electro-static current is further injected to the PNP type ESD BJT.

* * * * *